(12) United States Patent
Culp et al.

(10) Patent No.: US 7,935,638 B2
(45) Date of Patent: May 3, 2011

(54) METHODS AND STRUCTURES FOR ENHANCING PERIMETER-TO-SURFACE AREA HOMOGENEITY

(75) Inventors: James A. Culp, Hopewell Junction, NY (US); John J. Ellis-Monaghan, Essex Junction, VT (US); Jeffrey P. Gambino, Essex Juction, VT (US); Kirk D. Peterson, Essex Junction, VT (US); Jed H. Rankin, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/566,043

(22) Filed: Sep. 24, 2009

(65) Prior Publication Data

US 2011/0068436 A1    Mar. 24, 2011

(51) Int. Cl.
*H01L 21/302* (2006.01)
*H01L 21/461* (2006.01)

(52) U.S. Cl. ........ 438/712; 438/197; 438/199; 438/706; 438/769; 257/E21.027; 257/E21.051; 257/E21.068; 257/E21.077; 257/E21.17; 257/E21.218; 257/E21.229; 257/E21.267

(58) Field of Classification Search .................. 438/197, 438/199, 311, 637, 680, 706, 712, 733, 769; 257/E21.027, E21.051, E21.058, E21.077, 257/E21.17, E21.218, E21.229, E21.267
See application file for complete search history.

(56) References Cited

U.S. PATENT DOCUMENTS

| | | | |
|---|---|---|---|
| 5,770,884 A * | 6/1998 | Pogge et al. | .................. 257/506 |
| 5,899,706 A | 5/1999 | Kluwe et al. | |
| 2002/0116686 A1 | 8/2002 | Shin et al. | |
| 2004/0110069 A1 | 6/2004 | Lercel et al. | |
| 2005/0051809 A1 | 3/2005 | Smith et al. | |
| 2005/0132306 A1 | 6/2005 | Smith et al. | |
| 2005/0196964 A1 | 9/2005 | Smith et al. | |
| 2007/0101305 A1 | 5/2007 | Smith et al. | |

OTHER PUBLICATIONS

Black, et al., "Polymer self assembly in semiconductor microelectronics", IBM J. Res. & Dev. vol. 51 No. 5 Sep. 2007, pp. 605-633.

* cited by examiner

*Primary Examiner* — David Nhu
(74) *Attorney, Agent, or Firm* — Wood, Herron & Evans, LLP

(57) ABSTRACT

Methods and structures for enhancing the homogeneity in a ratio of perimeter to surface area among heterogeneous features in different substrate regions. At least one shape on the substrate includes an added edge effective to reduce a difference in the perimeter-to-surface area ratio between the features in a first substrate region and features in a second substrate region. The improved homogeneity in the perimeter-to-surface area ratio reduces variations in a thickness of a conformal layer deposited across the features in the first and second substrate regions.

12 Claims, 7 Drawing Sheets

METHODS AND STRUCTURES FOR ENHANCING PERIMETER-TO-SURFACE AREA HOMOGENEITY

BACKGROUND

The invention relates generally to semiconductor device fabrication and, in particular, to methods and structures for enhancing the homogeneity in a ratio of perimeter to surface area among heterogeneous features in different regions on a substrate.

Integrated circuits consist of devices, such as transistors and diodes, and other types of circuit elements, such as resistors and capacitors, linked together by conductive connections to form one or more functional electrical circuits. The devices and circuit elements are manufactured using a wafer that is subjected to a series of fabrication steps to form a pattern of identical integrated circuits. Following manufacture, the integrated circuits are separated from each other by a rectangular pattern of scribe lines or saw streets that serve as boundaries between the discrete chips or dice on the wafer. After singulation into discrete chips, each die is bonded to a substrate to define a packaged device.

The fabrication steps used to manufacture an integrated circuit generally involve the deposition and patterning of a series of layers of insulating and conductive materials. In certain cases, the inherent geometric properties of conformal materials may be used, rather than lithographic steps, for defining feature edges adjacent to other topological features. Layers deposited on planar surfaces may exhibit a high degree of thickness uniformity as a fraction of their overall thickness. However, the deposited thickness of a conformal layer on surfaces with features that supply a three-dimensional topography may vary in relationship to the local perimeter density of the underlying features.

The perimeter density is linked to the topography of the features by the number of feature edges. The resulting variations in layer thickness caused by the dependence on perimeter density may significantly impact device performance. In some instances, the variation in device performance may be as high as ten percent. For example, variations in the local pattern density may affect spacer thicknesses on gate electrodes of field effect transistors formed by complementary metal-oxide-semiconductor (CMOS) processes in different regions of an integrated circuit. In regions of high perimeter density for the gate electrodes, the thickness of the dielectric layer etched to define the spacers may be thinner than in regions of low perimeter density. Hence, the spacer thickness is reduced in high perimeter density regions, which causes the field effect transistors to be faster in these regions or to exhibit increased leakage in comparison with regions of low perimeter density for the gate electrodes. Differences in perimeter density may cause the spacer thickness to vary on different sidewalls of individual gate electrodes within a region. These resulting variations in device speed may cause introduce circuit timing problems.

Traditional rules for pattern density homogeneity, which are applied as constraints during circuit design, fail to address layer thickness variations arising from inhomogeneities in perimeter density. Designers must combine maximum linewidth and wide-line/wide-space rules with maximum local density rules. However, certain geometrical configurations of layout elements can obey all design rules and yet still be difficult to reliably manufacture. For example, the layout of gate electrodes may satisfy all design rules but yet experience significant variations in conformal film thickness because of the aforementioned perimeter density variations.

Improved methods and structures are needed that improve the deposition homogeneity of conformal layers on surfaces characterized by a surface topography with local variations in perimeter density.

BRIEF SUMMARY

In one embodiment of the invention, a method is provided for reducing variations in a ratio of perimeter to surface area between a plurality of first features in a first region on a substrate and a plurality of second features in a second region on a substrate. The method comprises adding an edge to at least one of the plurality of second features to increase a perimeter density in the second region. The increased perimeter density in the second region reduces a difference in the perimeter-to-surface area ratio between the plurality of first features in the first region and the plurality of second features in the second region.

In another embodiment of the invention, a method is provided for reducing variations in a ratio of perimeter to surface area between a plurality of first features in a first region on a substrate and a plurality of second features in a second region on a substrate. The method comprises adding a plurality of sub-lithographic fill shapes each having a surface, a sidewall extending from the surface toward a top surface of the substrate, and an edge at an intersection of the surface and sidewall to increase a perimeter density in the second region. The increased perimeter density in the second region reduces a difference in the perimeter-to-surface area ratio between the plurality of first features in the first region and the plurality of second features in the second region.

In another embodiment of the invention, a structure is provided for increasing homogeneity in a ratio of perimeter to surface area. The structure comprises a plurality of first features in a first region on a top surface of the substrate and a plurality of second features in a second region on the top surface of the substrate. The plurality of first features has a first perimeter-to-surface area ratio. The plurality of first features has a second perimeter-to-surface area ratio. At least one of the second features has at least one edge effective to reduce a difference between the first perimeter-to-surface area ratio and the second perimeter-to-surface area ratio.

In yet another embodiment of the invention, a structure is provided for increasing homogeneity in a ratio of perimeter to surface area. The structure comprises a plurality of first features and a plurality of sub-lithographic fill shapes on a top surface of the substrate. The plurality of sub-lithographic fill shapes have a second perimeter-to-surface area ratio greater than a first perimeter-to-surface area ratio of the plurality of first features in the first region.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
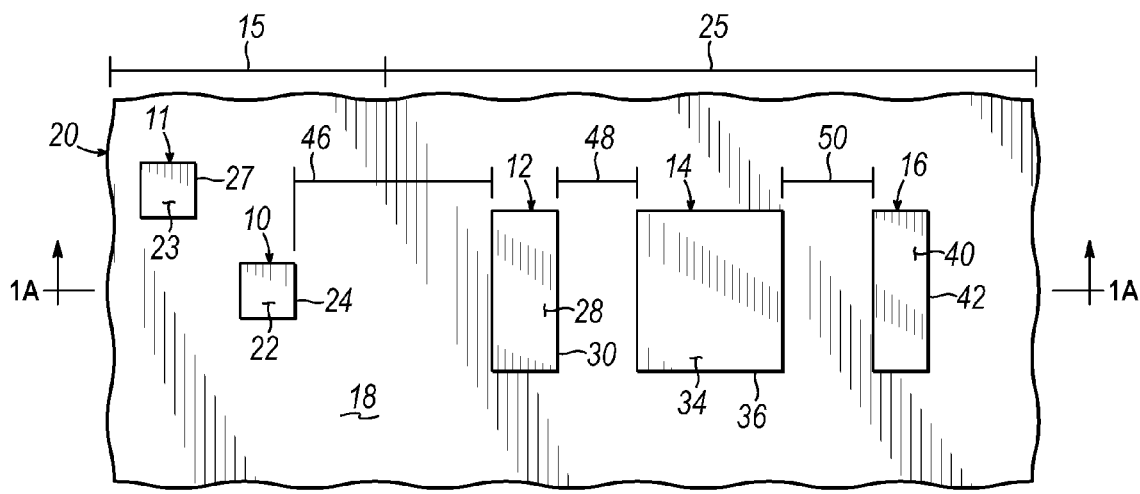
FIG. 1 is a diagrammatic top view of a portion of a substrate at an initial fabrication stage of a processing method in accordance with an embodiment of the invention.
Figure 1A:
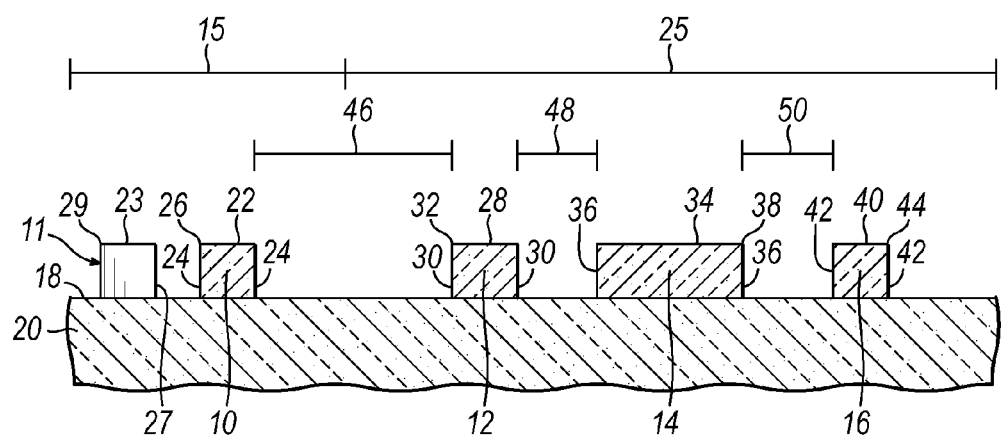
FIG. 1A is a diagrammatic cross-sectional view taken generally along line 1A-1A in FIG. 1.

With reference to FIGS. 1, 1A and in accordance with an embodiment of the invention, features 10, 11, 12, 14, 16 are directly supported on a top surface 18 of a substrate 20. Substrate 20 may be any suitable substrate that a person having ordinary skill in the art would recognize as suitable for forming an integrated circuit. For example, substrate 20 may be composed of single crystal or monocrystalline semiconductor material, such as silicon or another material that is primarily composed of silicon, and may constitute a bulk substrate or an epitaxial layer grown on a bulk substrate. The monocrystalline semiconductor material of the substrate 20 may contain a defect concentration and still be considered to be single crystal.

The features 10, 11, 12, 14, 16 are formed during front-end-of-line (FEOL) processing when the active devices of the integrated circuit are fabricated using the substrate 20. In an embodiment, the features 10, 11, 12, 14, 16 may be formed by a conventional photolithography and subtractive etching process that patterns a layer of a suitable material. To that end, the layer of the material from which the features 10, 11, 12, 14, 16 are composed and a hardmask layer (not shown) are applied as a layer stack to the top surface 18 of substrate 20 and coated with a resist layer (not shown) composed of a sacrificial organic material. The photolithography process entails exposing the resist layer to radiation imaged through a photomask and developing the resultant latent feature pattern in the exposed resist to define residual areas of resist layer that mask portions of the hardmask layer. The feature pattern is transferred from the resist layer to the hardmask layer by an anisotropic dry etch process, such as a reactive-ion etching (RIE) process. After the resist layer is removed by ashing or solvent stripping, the feature pattern is subsequently transferred from the hardmask layer to the layer of material using another anisotropic dry etch process and the patterned hardmask layer as a physical etch mask. In places where the hardmask layer is absent, the material in the underlying layer is removed to define the features 10, 11, 12, 14, 16. After the features 10, 11, 12, 14, 16 are defined from the layer of material, the hardmask layer is removed utilizing a conventional wet chemical stripping process, such as exposure to a solution containing a mixture of hydrofluoric and sulfuric acids.

In representative embodiments, the features 10, 11, 12, 14, 16 may be composed of doped or undoped polycrystalline silicon (polysilicon), a metal, a metal silicide, or a combination of these conductive materials. Each of the features 10, 11, 12, 14, 16 may be separated from the top surface 18 of substrate 20 by a thin layer (not shown) of a different material having a significantly lower electrical conductivity, such as a dielectric material like silicon dioxide ($SiO_2$), silicon oxynitride ($SiO_xN_y$), a hafnium-based high-k dielectric material like hafnium oxide ($HfO_2$) or hafnium silicate ($HfSiO_4$), and layered stacks of these materials. In certain embodiments, the features 10, 11, 12, 14, 16 may be gate electrodes for metal-oxide-semiconductor field effect transistors and dummy gates dispersed among the gate electrodes that are simultaneously patterned from the conductor layer along with the gate electrodes. In certain embodiments, at least one of the features 10, 11, 12, 14, 16 is a gate electrode and at least one of the features 10, 11, 12, 14, 16 is a dummy gate.

Feature 10 includes a top surface 22 and a sidewall 24 that extends from the top surface 22 toward the top surface 18 of the substrate 20. The sidewall 24 encircles the exterior of the feature 10 and intersects the top surface 22 at a corner along an edge 26. Feature 11 includes a top surface 23 and a sidewall 27 that extends from the top surface 23 toward the top surface 18 of the substrate 20. The sidewall 27 encircles the exterior of the feature 11 and intersects the top surface 23 at a corner along an edge 29.

Feature 12 includes a top surface 28 and a sidewall 30 that extends from the top surface 28 toward the top surface 18 of the substrate 20. The sidewall 30 encircles the exterior of the feature 12 and intersects the top surface 28 at a corner along an edge 32. Feature 14 includes a top surface 34 and a sidewall 36 that extends from the top surface 34 toward the top surface 18 of the substrate 20. The sidewall 36 encircles the exterior of the feature 10 and intersects the top surface 34 at a corner along an edge 38. Feature 16 includes a top surface 40 and a sidewall 42 that extends from the top surface 40 toward the top surface 18 of the substrate 20. The sidewall 42 encircles the exterior of the feature 10 and intersects the top surface 40 at a corner along an edge 44.

The features 10, 11, 12, 14, 16 have approximately equivalent thicknesses because a common layer of material the features 10, 11, 12, 14, 16 are formed by the conventional photolithography and subtractive etching process from. Consequently, the top surfaces 21, 22, 28, 34, 40 are contained in a common plane that is approximately parallel with a plane containing the top surface 18 of substrate 20. Sidewall 24 of feature 10 is separated by a gap 46 from the sidewall 30 of feature 12, sidewall 30 of feature 12 is separated by a gap 48 from the sidewall 36 of feature 14, and sidewall 36 of feature 14 is separated by a gap 50 from the sidewall 42 of feature 16. Gap 46 is larger than gaps 48, 50.

Each of the features 10, 11, 12, 14, 16 occupies a definite surface area on the top surface 18 of the substrate 20. The surface areas occupied by the features 10, 11, 12, 14, 16 are determined from feature length and feature width, which are among the parameters chosen during the design phase of manufacture. In particular and assuming vertical sidewalls 24, 27, 30, 36, 42, the product of the length and width of the top surfaces 22, 23, 28, 34, 40 determines the respective surface area of features 10, 11, 12, 14, 16 in the representative embodiment. Each of the features 10, 11, 12, 14, 16 has a perimeter given by the length of the respective edge 24, 29, 32, 38, 44.

Features 10 and 11 are representative features residing in a region 15 of a given surface area on the substrate 20. Region 15 is characterized by a total perimeter given by the sum of the perimeter of edges 24, 29, as well as the perimeter of edges on any other similar features (not shown) in region 15. The perimeter density of region 15 is equal to the average perimeter per feature in region 15, which is calculated in a known manner. Region 15 is characterized by a total surface area that features 10, 11 and similar features (not shown) in region 15 occupy as a footprint on the top surface 18 of substrate 20. The total surface area of the features 10, 11 in region 15 may be calculated and mathematically averaged in a known manner to yield an average surface area per feature for region 15. A ratio of the total perimeter of region 15 to the total surface of region 15 yields a perimeter-to-surface area ratio for region 15, which may be divided by the total number of features in region 15 to yield an average value.

Features 12, 14, 16 are representative features residing in a region 25 of a given surface area on the substrate 20 in which adjacent pairs of features 12, 14, 16 are more densely packed. Region 25 is characterized by a total perimeter given by the sum of the perimeter of edges 32, 38, 44, as well as the perimeter of edges on any other similar features (not shown) in region 25. The perimeter density of region 25 is given by the average perimeter per feature in region 25, which is calculated in a known manner. Region 25 is characterized by a total surface area that features 12, 14, 16 occupy as a footprint on the top surface 18. The total surface area of the features 12, 14, 16 in region 25 may be calculated and mathematically averaged in a known manner to yield an average surface area per feature for region 25. Feature 14 has a surface area that is greater than the average surface area in region 25. A ratio of the total perimeter of region 25 to the total surface of region 25 yields a perimeter-to-surface area ratio for region 25, which may be divided by the total number of features in region 25 to yield an average value. In the representative embodiment, the perimeter-to-surface area ratio in region 25 is larger than the perimeter-to-surface area ratio in region 15.

Figure 2:
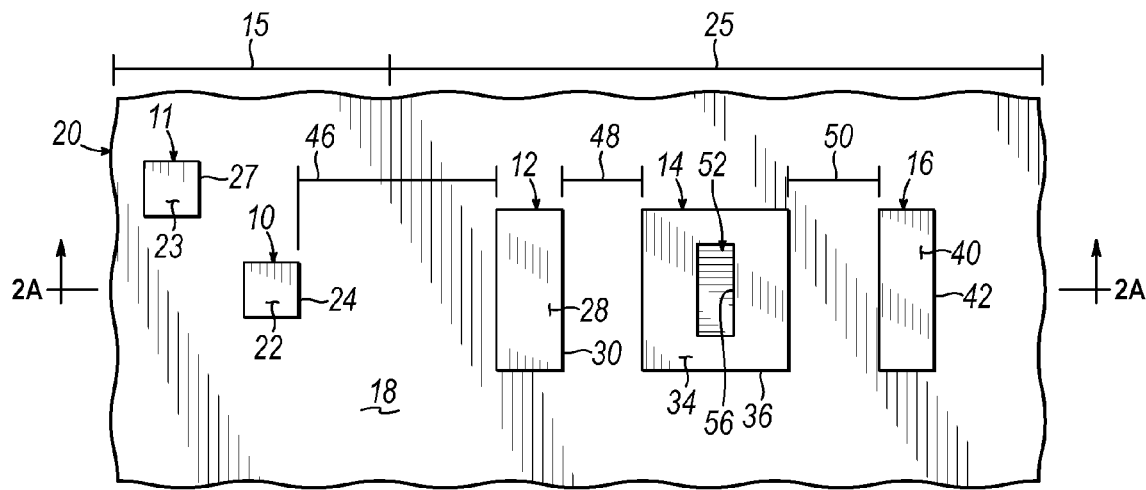
FIG. 2 is a diagrammatic top view of the portion of the substrate at a fabrication stage of the processing method subsequent to FIG. 1.
Figure 2A:
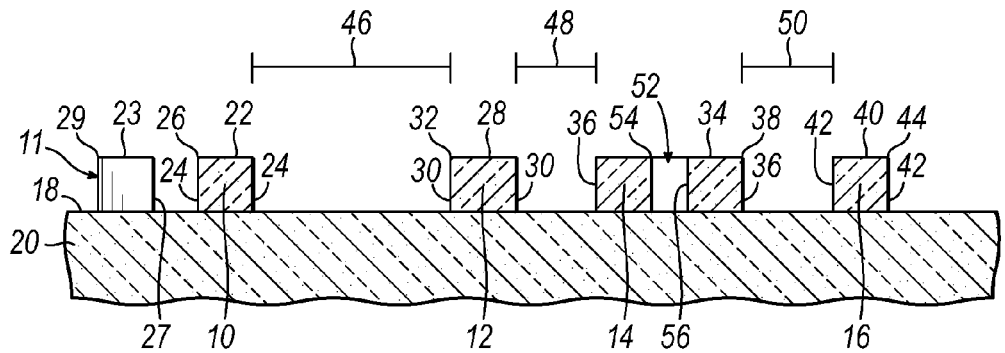
FIG. 2A is a diagrammatic cross-sectional view taken generally along line 2A-2A in FIG. 2.

With reference to FIGS. 2, 2A in which like reference numerals refer to like features in FIGS. 1, 1A and at a subsequent fabrication stage, one or more portions of the feature 14 are modified by a "cheesing process" or metal slotting process. In the representative embodiment, an opening or aperture 52 is formed inside the interior of feature 14 without intersecting the sidewall 36 and that extends in depth to the top surface 18 of the substrate 20. The aperture 52 defines a sidewall 56 extending from the top surface 34 of feature 14 to the top surface 18 of the substrate 20. The sidewall 56 intersects the top surface 34 along an edge 54. Generally, aperture 52 is a recess that is indented below a plane containing the top surface 34 of feature 14 and, in the representative embodiment, is shaped as a rectangular slot or a square hole.

The perimeter of feature 14 is increased by the addition of the perimeter of edge 54 to the perimeter of edge 36, which increases the ratio of perimeter to surface area for feature 14. The edge 54 is additive to feature 14 and is not formed by the intersection of the sidewall 36 of feature 14 with the top surface 34 of feature 14. The surface area of feature 14 defined by the feature footprint on surface 18 is unchanged by the addition of aperture 52 and edge 54. The edge 54 is inscribed inside of the peripheral edge 28 encircling the top surface 34 feature 14 and, therefore, is non-coincident with edge 28. Locally, the perimeter density in region 25 is increased by the addition of edge 54 to edges 30, 36, 42 without modifying the area density, which increases the perimeter-to-surface area ratio within region 25.

The increased perimeter-to-surface area ratio in region 25 serves functionally to improve the homogeneity of the perimeter-to-surface area ratio among the different regions 15, 25. In other words, the variance (the second moment around the mean) of the perimeter-to-surface area ratio is reduced among the different regions 15, 25 because of the increase in the perimeter-to-surface area ratio within region 25.

The "cheesing" used to form aperture 52 may be automatically generated using algorithms in an Electronic Design Automation (EDA) layout-related tool during a design phase. Accordingly, additional masking layers are not required to implement the cheesing of the feature 14 into the process flow of fabrication. In an alternative embodiment, multiple apertures (not shown) each similar to aperture 52 may be formed in the feature 14. If each of the apertures 52 is a rectangular slot, the long axis of each of the slotted apertures may be aligned in the same direction. Alternatively, additional features in region 25 may be selected for modification during the design phase to incorporate an aperture (not shown) similar or identical to aperture 52.

Figure 3:
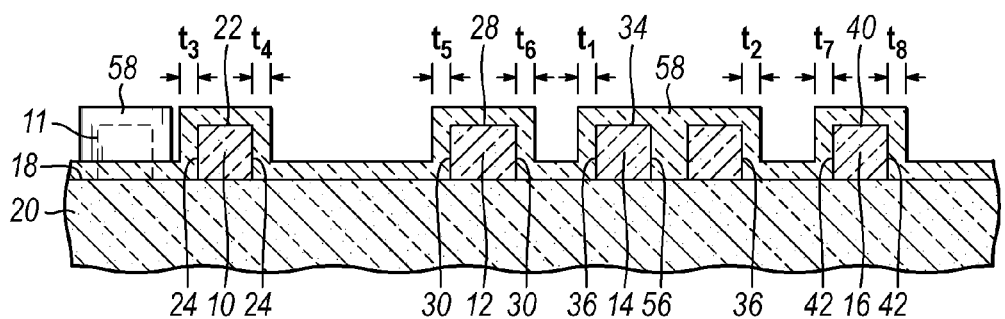
FIG. 3 is a diagrammatic cross-sectional view at a fabrication stage of the processing method subsequent to FIG. 2A.

With reference to FIG. 3 and in which like reference numerals refer to like features in FIGS. 2, 2A and at a subsequent fabrication stage, a conformal layer 58 of a material is deposited across the surface area of the substrate 20, including across the features 10, 11, 12, 14, 16. A portion of the material from the conformal layer 58 fills the aperture 52 defined in feature 14. As mentioned above, the presence of the aperture 52 changes the topography and increases the local perimeter-to-surface area ratio for feature 14 and in region 25. As a consequence, the presence of the aperture 52 produces a smaller deviation among the thicknesses, $t_1$, $t_2$, of the conformal layer 58 on different portions of the sidewall 36 of feature 14 and the thicknesses, $t_3$, $t_4$, of the conformal layer 58 on different portions of the sidewall 24 of feature 10, the thicknesses, $t_5$, $t_6$, of the conformal layer 58 on different portions of the sidewall 30 of feature 12, and the thicknesses, $t_7$, $t_8$, of the conformal layer 58 on different portions of the sidewall 42 of feature 16. A similar relationship is observed for the thicknesses of the conformal layer 58 on different portions of the sidewall 27 of feature 11. In other words, the variance in the thickness of the conformal layer 58 on the sidewalls of the different features 10, 12, 14, 16 is reduced by the increase in the perimeter-to-surface area ratio of region 25.

In addition, the presence of the aperture 52 produces a smaller deviation among the thicknesses of the conformal layer 58 on different portions of the sidewalls 24, 27, 30, 36, 42 of the features 10, 11, 12, 14, 16. For example, the presence of the aperture 52 reduces the difference in the thickness, $t_5$, on the portion of the sidewall 30 of feature 12 that faces toward feature 10 across gap 46 is more similar to the thickness, $t_6$, on the portion of the sidewall 30 of feature 12 that faces toward feature 14 across gap 48.

The improvement in the uniformity of the conformal layer 58 is achieved without altering the pattern density of the features 10, 11 or the pattern density of features 12, 14, 16 and without modifying other physical parameters, such as feature dimensions and spacing of features 12, 14, 16. Instead, at least one of the features 12, 14, 16 in region 25, such as the representative feature 14, is modified to include the aperture 52. The electrical performance of the modified feature 14, assuming that the feature 14 is not a dummy feature, is preferably not altered by the introduction of the aperture 52.

In one embodiment, the conformal layer 58 may be a stress liner composed of a dielectric material that is electrically insulating and that is either under compressive or tensile stress. The compressive or tensile stress is transferred from the conformal layer 58 to at least the features 10, 11, 12, 14, 16 and/or other features on substrate 20 similar to features 10, 11, 12, 14, 16. In a representative embodiment, the dielectric material in the conformal layer 58 may be composed of silicon nitride ($Si_3N_4$) deposited by chemical vapor deposition (CVD), plasma-enhanced CVD, or high density plasma CVD in which the deposition process parameters, such as plasma power and gas flow rates, are controlled to incorporate an amount of compressive or tensile stress.

Figure 3A:
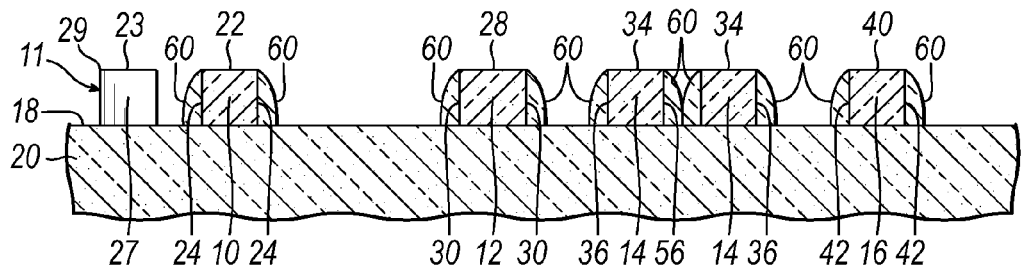
FIG. 3A is a diagrammatic cross-sectional view similar to FIG. 3 and in accordance with an alternative embodiment of the invention.

With reference to FIG. 3A in which like reference numerals refer to like features in FIG. 3 and in accordance with an alternative embodiment, the conformal layer 58 may be further processed by a subsequent fabrication stage. For example, the conformal layer 58 may be shaped to define spacers 60 on the respective sidewalls 24, 29, 30, 36, 42 of features 10, 11, 12, 14, 16. In a representative embodiment, the conformal layer 58 used to make the spacers 60 is a dielectric material, such as five (5) nm to fifty (50) nm of $Si_3N_4$ deposited by CVD, that is shaped by a directional anisotropic etching process, such as a RIE process, to preferentially remove the dielectric material from horizontal surfaces. The improved uniformity of the conformal layer 58 produced by the increase in the perimeter-to-surface area ratio of region 25 and concomitant improvement in homogeneity in the different perimeter-to-surface ratios of regions 15, 25 improves the uniformity of the thickness of the spacers 60, which in turn improves the uniformity of device performance.

Figure 4:
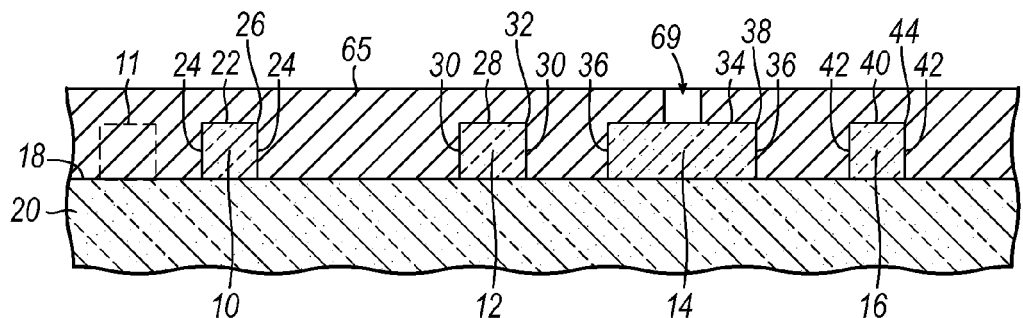
FIGS. 4-6 are diagrammatic cross-sectional views of a portion of a substrate at successive fabrication stages of a processing method in accordance with an alternative embodiment of the invention.

With reference to FIG. 4 in which like reference numerals refer to like features in FIG. 1A and at a subsequent fabrication stage in accordance with an alternative embodiment of the invention, one or more layers of a patterned mask 65 are applied to the substrate 20. In one embodiment, the patterned mask 65 is a resist layer composed of a sacrificial organic material that is applied and then patterned by a conventional photolithography process to form an opening 69 registered with the top surface 34 of feature 14. The opening 69 is inside the outer perimeter of the top surface 34.

Figure 5:
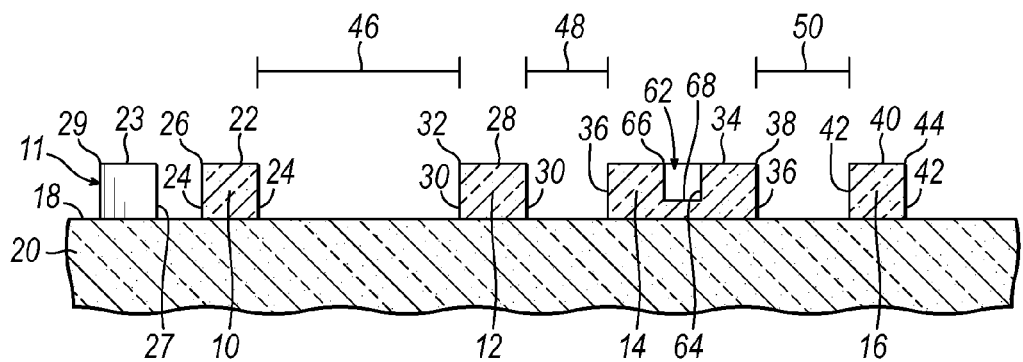

With reference to FIG. 5 in which like reference numerals refer to like features in FIG. 4 and at a subsequent fabrication stage, an opening or aperture 62 is formed in feature 14 that extends toward the top surface 18 of substrate 20, but only partially through the thickness of the feature 14. The aperture 62 is formed by an etching process that removes a portion of feature 14 exposed by the opening 69 as an unmasked region. The aperture 62 defines a sidewall 64 in feature 14 that intersects the top surface 34 along an edge 66. A portion of the material of the feature 14, which has a reduced thickness within the aperture 62 relative to the full thickness of feature 14, separates a base 68 of the aperture 62 from the top surface 18 of the substrate 20. The base 68 of the aperture 62 is connected with the top surface 34 by the sidewall 64.

The edge 66 at the intersection between the top surface 34 and the sidewall 64 increases the perimeter-to-surface area ratio of feature 14 and, as a result, the perimeter-to-surface area ratio of region 25. In various embodiments, the aperture 62 in the feature 14 may have various geometrical shapes, such as a rectangular slot or a square hole, which is established by the opening 69 in the patterned mask 65. The edge 66 is additive to feature 14 and is not formed by the intersection of the sidewall 36 of feature 14 with the top surface 34 of feature 14. The surface area of feature 14 defined by the feature footprint on surface 18 is unchanged by the addition of aperture 62 and edge 66. The edge 66 is inscribed inside of the peripheral edge 28 encircling the top surface 34 feature 14 and, therefore, is non-coincident with edge 28.

Figure 6:
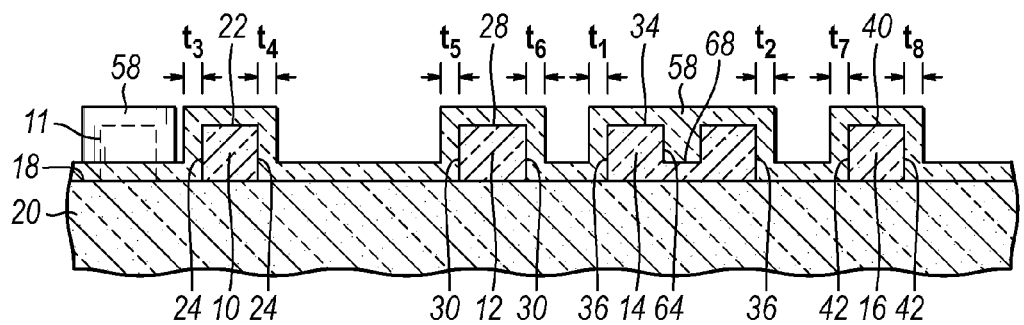

With reference to FIG. 6 in which like reference numerals refer to like features in FIG. 5 and at a subsequent fabrication stage, the conformal layer 58 of a material is deposited across the surface area of the substrate 20, including across the features 10, 11, 12, 14, 16. A portion of the material from the conformal layer 58 fills the aperture 62 defined in feature 14. The presence of the aperture 62 changes the topography and increases the local perimeter area density near feature 14. The presence of the edge 66 increases the total perimeter of feature 14. Consequently, the presence of aperture 62 increases the ratio of perimeter-to-surface area ratio for feature 14 and locally in region 25 which improves the homogeneity of the perimeter-to-surface area ratio among the different regions 15, 25. In other words, the variance (the second moment around the mean) of the perimeter-to-surface area ratio is reduced among the different regions 15, 25 by the increased perimeter-to-surface area ratio in region 25.

The effect of the aperture 62 upon the deposited conformal layer 58 is to improve the film thickness uniformity in a manner similar to the effect of aperture 52, as described above. Consequently, there is a smaller deviation among the thicknesses, $t_1$, $t_2$, of the conformal layer 58 on different portions of the sidewall 36 of feature 14, the thicknesses, $t_3$, $t_4$, of the conformal layer 58 on different portions of the sidewall 24 of feature 10, the thicknesses, $t_5$, $t_6$, of the conformal layer 58 on different portions of the sidewall 30 of feature 12, and the thicknesses, $t_7$, $t_8$, of the conformal layer 58 on different portions of the sidewall 42 of feature 16. A similar relationship is observed for the thicknesses of the conformal layer 58 on different portions of the sidewall 27 of feature 11. In addition, there is a smaller deviation among the thicknesses of the conformal layer 58 on different portions of the sidewall 24, 27, 30, 36, 42 of each of the features 10, 11, 12, 14, 16. For example, the presence of the aperture 62 reduces the difference in the thickness, $t_5$, on the portion of the sidewall 30 of feature 12 that faces toward feature 10 across gap 46 is more similar to the thickness, $t_6$, on the portion of the sidewall 30 of feature 12 that faces toward feature 14 across gap 48.

Figure 7:
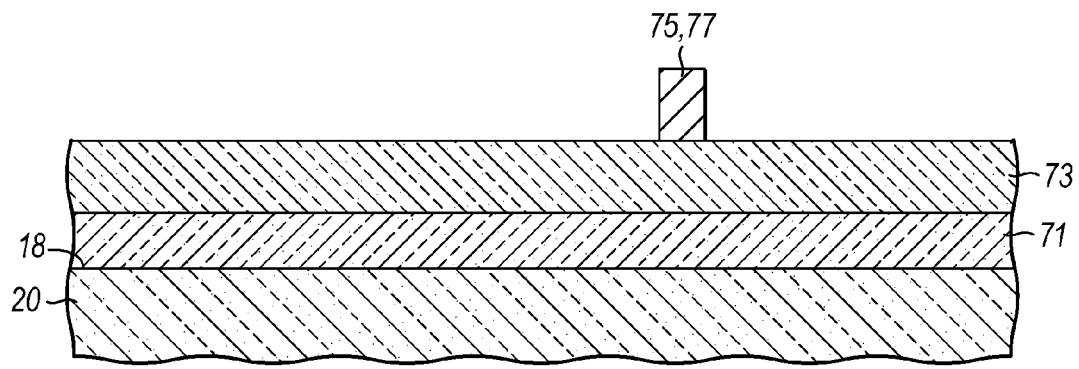
FIGS. 7-9 are diagrammatic cross-sectional views of a portion of a substrate at successive fabrication stages of a processing method in accordance with an alternative embodiment of the invention.

With reference to FIG. 7 in which like reference numerals refer to like features in FIG. 1A and at a subsequent fabrication stage in accordance with an alternative embodiment of the invention, a layer 71 of a material used to form the features 10, 11, 12, 14, 16 is applied to the top surface 18 of substrate 20, a layer 73 of a material that etches selectively to the material in layer 71 is applied on layer 71, and a patterned mask 75 is applied on the layer 73. In one embodiment, the material in layer 73 may be composed of an oxide of silicon, such as silicon dioxide ($SiO_2$). In one embodiment, the patterned mask 75 is a resist layer composed of a sacrificial organic material that is applied and then patterned by a conventional photolithography process to form a mask feature 77 that will ultimately be registered with the top surface 34 of feature 14. The mask feature 77 is inscribed inside the edge 36 encircling the top surface 34.

Figure 8:
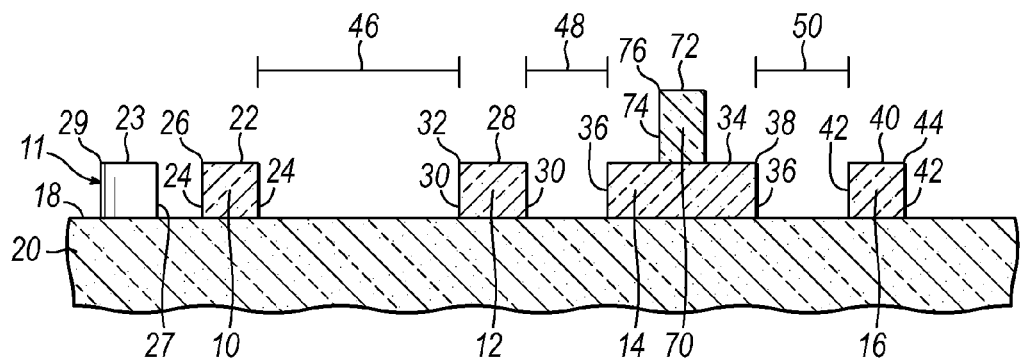

With reference to FIG. 8 in which like reference numerals refer to like features in FIG. 7 and at a subsequent fabrication stage, a mandrel 70 is formed on the top surface 34 of feature 14 and in direct contact with the top surface 34 by etching the layer 73. The mandrel 70 is defined from a portion of layer 73 masked by patterned mask 75. The mandrel 70 projects away from the feature 14 and is formed by a conventional subtractive etching process from a layer of a suitable mandrel material deposited across the surface area of the substrate 20. The mandrel 70 includes a top surface 72 and a sidewall 74 extending from the top surface 72 to the top surface 34 of feature 14. The top surface 72 and sidewall 74 intersect along an edge 76 that, in the representative embodiment, circumscribes the top surface 72. The mandrel 70 generally has a geometrical shape of a projection that protrudes outward from the top surface 34 of feature 14 and, in the representative embodiment, is trapezoidal in shape. Features 10, 11, 12, 14, 16 are then formed by a masked subtractive etching process, as described previously with regard to FIG. 1.

Figure 9:
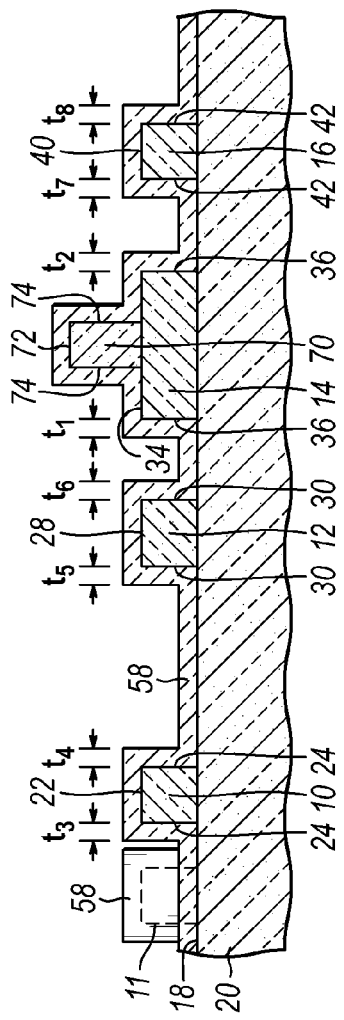

With reference to FIG. 9 in which like reference numerals refer to like features in FIG. 8 and at a subsequent fabrication stage, the conformal layer 58 of a material is deposited across the surface area of the substrate 20, including across the features 10, 12, 14, 16 and mandrel 70. The presence of the mandrel 70 changes the topography and increases the local perimeter area density near feature 14. The edge 66 is additive to feature 14 and is not formed by the intersection of the sidewall 36 of feature 14 with the top surface 34 of feature 14. The edge 66 is inscribed inside of the peripheral edge 28 encircling the top surface 34 feature 14 and, therefore, is non-coincident with edge 28.

The edge 76 of mandrel 70 operates to increase the total perimeter of feature 14. However, the surface area occupied by the footprint of feature 14 on the top surface 18 of substrate 20 is unchanged by the addition of the mandrel 70 and edge 76. Consequently, the presence of mandrel 70 increases the ratio of perimeter-to-surface area of feature 14 and the ratio of perimeter-to-surface area within region 25 on the top surface 18. The difference in perimeter-to-surface area ratio between region 15 and region 25 is thereby reduced.

The impact of the mandrel 70 upon the deposited conformal layer 58 is to improve the film thickness uniformity in a manner similar to the effect of aperture 52 and aperture 62, as described above. Consequently, there is a smaller deviation among the thicknesses, $t_1$, $t_2$, of the conformal layer 58 on different portions of the sidewall 36 of feature 14 and the thicknesses, $t_3$, $t_4$, of the conformal layer 58 on different portions of the sidewall 24 of feature 10, the thicknesses, $t_5$, $t_6$, of the conformal layer 58 on different portions of the sidewall 30 of feature 12, and the thicknesses, $t_7$, $t_8$, of the conformal layer 58 on different portions of the sidewall 42 of feature 16. A similar relationship is observed for the thicknesses of the conformal layer 58 on different portions of the sidewall 27 of feature 11. In addition, there is a smaller deviation among the thicknesses of the conformal layer 58 on different portions of the sidewall 24, 27, 30, 36, 42 of each of the features 10, 11, 12, 14, 16. For example, the presence of the mandrel 70 reduces the difference in the thickness, $t_5$, on the portion of the sidewall 30 of feature 12 that faces toward feature 10 across gap 46 is more similar to the thickness, $t_6$, on the portion of the sidewall 30 of feature 12 that faces toward feature 14 across gap 48.

Figure 10:
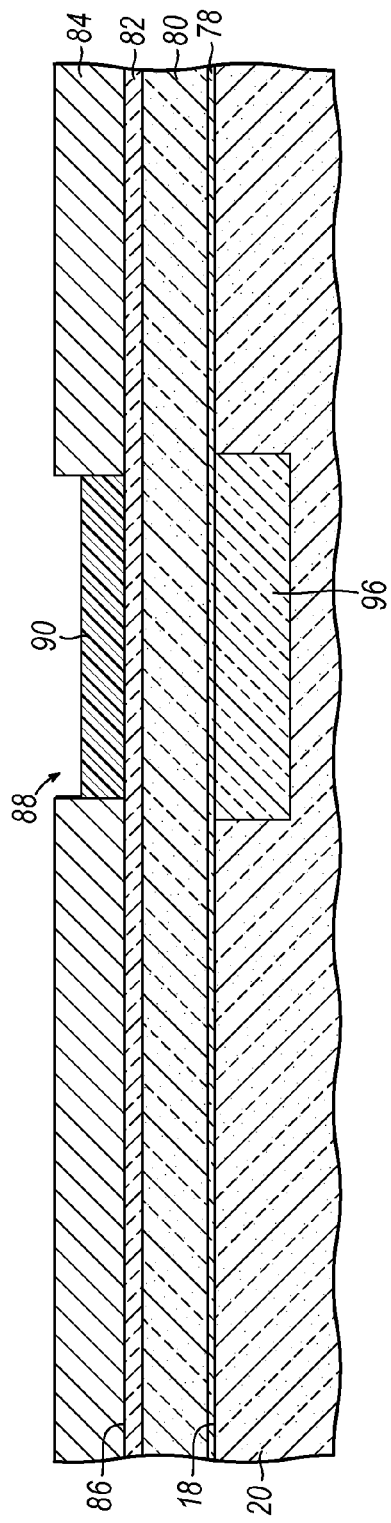
FIGS. 10-13 are diagrammatic cross-sectional views of a portion of a substrate at successive fabrication stages of a processing method in accordance with an alternative embodiment of the invention.

With reference to FIG. 10 in which like reference numerals refer to like features in FIG. 1A and at a subsequent fabrication stage in accordance with an alternative embodiment of the invention, a layer 78 of a dielectric material is directly applied to the top surface 18 of the substrate 20 by a conventional deposition process and a layer 80 of a material, such as polycrystalline silicon, is directly applied onto dielectric layer 78 by a conventional deposition process. In representative embodiments, layer 78 may be composed of a dielectric material like $SiO_2$, $SiO_xN_y$, a hafnium-based high-k dielectric material like $HfO_2$ or $HfSiO_4$, and layered stacks of these materials. Layer 80, which is separated from the top surface 18 of substrate 20 by the thinner layer 78, is composed of a different material having a significantly higher electrical conductivity, such as doped or undoped polysilicon, a metal, a metal silicide, or a combination of these conductors. In certain embodiments, the layers 78, 80 are used to fashion gate stacks from metal-oxide-semiconductor field effect transistors and dummy gates that are fashioned from stacked dielectric and conductor layers.

A hardmask layer 82 is deposited across and over layer 80 in order to supply an etch mask for the transfer of a nanopattern and a conventional pattern into the layer 80. The material constituting the hardmask layer 82 is selected to etch selectively to the material constituting layer 80 and to be readily removed at a subsequent stage in the fabrication process. In one embodiment, hardmask layer 82 may be composed of an oxide or nitride of silicon, such as $SiO_2$ or $Si_3N_4$ deposited by a CVD process, or a layered combination of these materials. Alternatively, the hardmask layer may be composed of $SiO_2$ grown by thermally oxidizing layer 80 or may be composed of a different type of material, such as $SiO_xN_y$.

A resist layer 84 composed of a radiation-sensitive organic material is applied as a thin film to the top surface 86 of hardmask layer 82 by spin coating. The resist layer 84 is pre-baked, exposed to radiation to impart a latent image of a pattern for openings including the representative opening 88, baked, and then developed with a chemical developer. The chemical developer removes nonpolymerized material to transform the latent image of openings 88 in the resist layer 84 into a final image pattern. Each of the openings 88 defines a window that reveals a distinct surface area of hardmask layer 82. Procedures for applying and lithographically patterning the resist layer 84 using a photomask and lithography tool are known to a person having ordinary skill in the art.

A thin film 90 of a diblock copoloymer is applied in each opening 88 defined in hardmask layer 82. A solution containing the diblock copolymer as a solute can be applied by any suitable technique including, but not limited to, spin coating, spraying, ink coating, and dip coating. In one embodiment, the diblock copolymer constituting the thin film 90 may be a polystyrene-polymethylmethacrylate (PS-PMMA) diblock copolymer. However, in other embodiments, the thin film 90 may be formed from any suitable diblock copolymer material capable of self-assembling to provide a nanometer scale pattern. To form the thin film 90, the diblock copolymer material is dissolved in a suitable solvent to form a solution, which is then applied onto the substrate surface.

Figure 11:
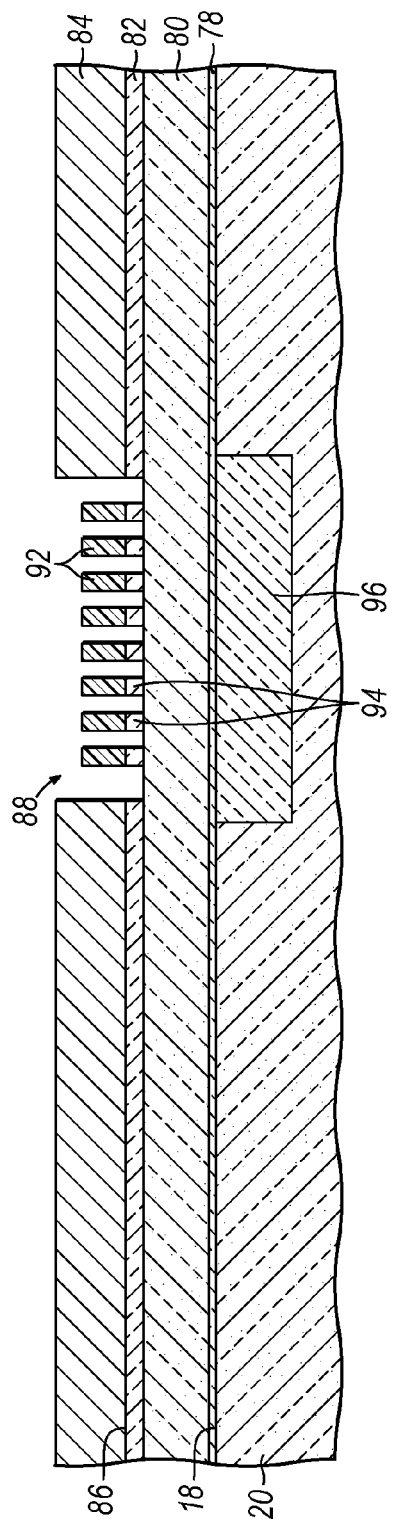

With reference to FIG. 11 in which like reference numerals refer to like features in FIG. 10 and at a subsequent fabrication stage, the thin film 90 (FIG. 8) is patterned by a thermally annealing process that heats the constituent diblock copolymer above its glass transition temperature but below a temperature threshold at which the diblock copolymer will decompose or degrade. For example, the thermal annealing may be conducted at a temperature of 200° C. to 300° C. for a heating time ranging from 1 hour to 12 hours. In response to the thermal annealing, the diblock copolymer in the thin film 90 spontaneously assembles and organizes itself into a repeating pattern by microphase separation of the different constituent polymer blocks. The spontaneously assembled diblock copolymer in the thin film 90 forms ordered domains at nanometer-scale dimensions that define a pattern. Specifically, within each opening 88, the pattern includes a regular array of nanometer-scale columnar structures 92 (i.e., columns that are substantially perpendicular to the plane of the thin film 90) in one domain. The vertical columnar structures 92 have a sub-lithographic, sub-critical dimension. The vertical columnar structures 92 are embedded in a matrix (not shown) of the other domain. In the specific embodiment of the PS-PMMA diblock copolymer, the vertical columnar structures 92 in one domain are composed of polystyrene (PS) and the matrix in the other domain is composed of PMMA.

Following self assembly, one domain of the copolymer can be selectively removed to pattern the thin film 90. The remaining patterned domain defines the vertical columnar structures 92 used as an etch mask for patterning nano-dimensioned, sub-lithographic features into the hardmask layer 82. For example, one domain of the diblock copolymer film may be stable when exposed to a particular solvent, while another domain of the diblock copolymer film is dissolved by the solvent. In the representative embodiment of FIG. 8, the matrix has been removed so that the vertical columnar structures 92 remain. In the specific embodiment of the PS-PMMA diblock copolymer, the masking layer is formed by developing the diblock copolymer film with a solvent to remove the matrix, which leaves behind the regular, repeating pattern of columnar structures containing polystyrene. The resulting vertical columnar structures 92 serve as a lithography mask for a subsequent etch of the hardmask layer 82.

The sub-lithographic feature pattern defined by the vertical columnar structures 92 is transferred from the diblock copolymer thin film 90 to the hardmask layer 82 by an anisotropic dry etch process, such as a RIE process, to define sub-lithographic, nanometer-sized features 94 in hardmask layer 82. The opening 88 operates to self-align the features 94 in the hardmask layer 82 with underlying structure, such as the representative shallow trench isolation (STI) region 96 in substrate 20. The STI region 96 is composed of an electrically insulating material and is formed in a manner familiar to a person having ordinary skill in the art.

Figure 12:
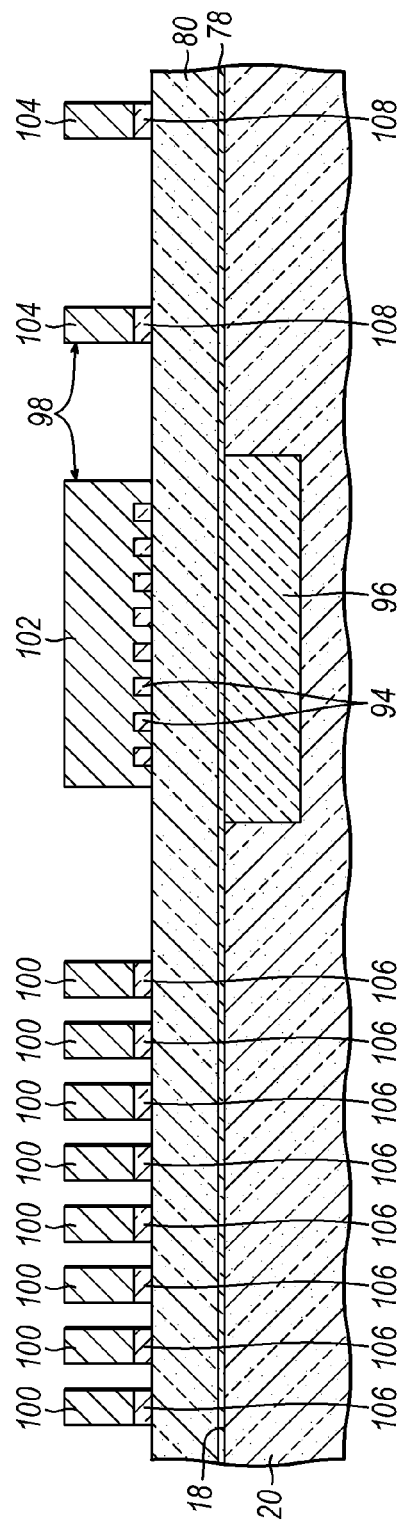

With reference to FIG. 12 in which like reference numerals refer to like features in FIG. 11 and at a subsequent fabrication stage, the resist layer 84 and diblock copolymer film 90 are removed by, for example, ashing or solvent stripping. Another resist layer 98 composed of a radiation-sensitive organic material is applied by spin coating, pre-baked, exposed to radiation to impart a latent image pattern, baked, and then developed with a chemical developer. The chemical developer removes nonpolymerized material to transform the latent feature image in the resist layer 98 into a final image pattern that includes features 100, 102, 104. Each of the features 100, 102, 104 defines a masked region on the hardmask layer 82. Procedures for applying and lithographically patterning the resist layer 98 using a photomask and lithography tool are known to a person having ordinary skill in the art. Feature 102 of the resist layer 98 covers and protects the nanometer-sized features 94 formed in the hardmask layer 82 during the preceding fabrication stage. The features 100, 104 are transferred from the patterned resist layer 98 to the hardmask layer 82 by an anisotropic dry etch process, such as a RIE process, to define features 106, 108 in hardmask layer 82. The resist layer 98 is the removed from the hardmask layer 82 by, for example, ashing or solvent stripping.

Figure 13:
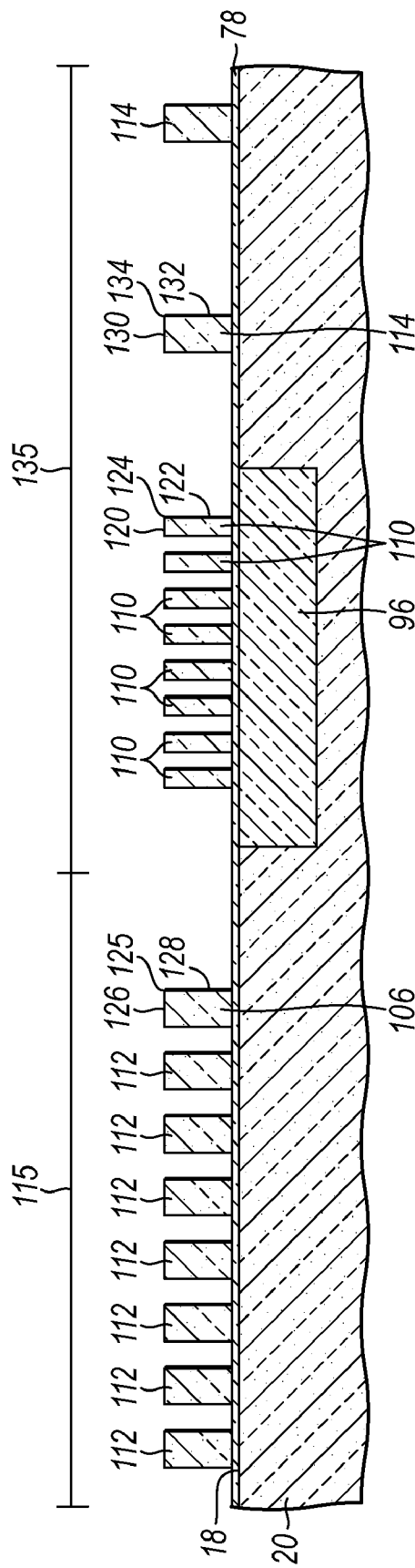

With reference to FIG. 13 in which like reference numerals refer to like features in FIG. 12 and at a subsequent fabrication stage, the sub-lithographic, nanometer-sized features 94 and the larger-dimensioned features 106, 108 in the hardmask layer 82 are transferred an anisotropic dry etch process, such as a RIE process, to define features 110, 112, 114, respectively, in the material of layer 80. The dry etch process is extended to etch through layer 78 to the top surface 18 of substrate 20 such that each of the features 110, 112, 114 is separated from the top surface 18 by a residual portion of layer 78.

Features 112, 114 have standard lithographic dimensions, whereas the features 110 have sub-lithographic or sub-resolution dimensions that prohibit accurate formation by the photolithographic techniques used to form conventional features, such as features 112, 114, comprising the circuitry of an integrated circuit. Features 110 are not achievable by using photolithography to form them directly and are smaller than the finest resolution photolithography processes can produce. The features 110, which are disposed over the STI region 96 that does not contain active devices of the integrated circuit, operate as fill shapes and are not electrically active in the integrated circuit.

Each of the features 110 has a top surface 120, a sidewall 122 extending from the top surface 120 toward the top surface 18 of substrate 20, and an edge 124 defined at the intersection of the sidewall 122 with the top surface 120. Each of the features 112 has a top surface 126, a sidewall 128 extending from the top surface 126 toward the top surface 18 of substrate 20, and an edge 125 defined at the intersection of the sidewall 128 with the top surface 126. Each of the features 114 has a top surface 130, a sidewall 132 extending from the top surface 130 toward the top surface 18 of substrate 20, and an edge 134 defined at the intersection of the sidewall 132 with the top surface 130. The hardmask layer 82 is removed utilizing a conventional wet chemical stripping process, such as exposure to a solution containing a mixture of hydrofluoric and sulfuric acids.

Without considering the added features 110, the features 112 are located in a region 115 of a given surface area characterized by a higher perimeter-to-surface area ratio than a region 135 containing features 114. In a specific embodiment, the features 112, 114 may be gate electrodes for active devices, such as field effect transistors, of an integrated circuit and/or non-functional dummy gates dispersed among the gate electrodes that are formed by a conventional photolithography and etching process from a layer of a suitable conductor, such as doped polysilicon. The features 110 represent fill shapes that are added between the sub-region containing features 112, which is a relatively high perimeter density region, and the sub-region containing features 114, which is a relatively low perimeter density region.

The features 110 have a significantly higher perimeter-to-surface area ratio than either of the features 112 or features 114. The increased perimeter density arising from the features 110 acts to improve the homogeneity of the perimeter-to-surface area ratio among the different regions 115, 135. In other words, the variance (the second moment around the mean) of the perimeter-to-surface area ratio is reduced among the different regions 115, 135. The contribution from the edge 124 on each of the features 110 effectively increases the perimeter-to-surface area ratio in region 135 (or, alternatively, may be considered to decrease the perimeter-to-surface area ratio in region 115.

In the representative embodiment, the features 110 overlie the STI region 96, which is a field on the top surface 18 of substrate 20 not normally used for active devices in the integrated circuit. The presence of the features 110 and the increase in the perimeter-to-surface area ratio within region 135 produces a smaller deviation in the thickness of a conformal layer (not shown but similar to conformal layer 58) of, for example, a dielectric material applied on the sidewalls 128 and 132 of the active features 112, 114. In other words, the variance in the thickness of the conformal layer on the sidewalls 128 and 132 of the different features 112, 114 is reduced. In addition, the addition of the sub-lithographic, nanometer-sized features 110 produces a smaller deviation among the thicknesses of the conformal layer on different portions of the sidewall 128, 132 of each of the features 112, 114.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of reducing variations in a ratio of perimeter to surface area between a plurality of first features in a first region on a substrate and a plurality of second features in a second region on a substrate, the method comprising:
    adding an edge to at least one of the plurality of second features to increase a perimeter density in the second region and thereby reduce a difference in a first perimeter-to-surface area ratio of the plurality of first features in the first region and a second perimeter-to-surface area ratio of the plurality of second features in the second region.

2. The method of claim 1 wherein the at least one of the plurality of second features has a surface, and adding the edge to the at least one of the plurality of second features comprises:
    forming an aperture having a sidewall that extends from the surface inwardly and at least partially through at least one of the plurality of first features so that the edge is defined by an intersection of the sidewall and the surface.

3. The method of claim 2 wherein defining the aperture comprises:
    forming a patterned mask having an opening aligned with the surface of the at least one of the plurality of second features; and
    etching the at least one of the plurality of second features through the opening to form the aperture.

4. The method of claim 2 wherein the aperture extends through the at least one of the plurality of second features to a top surface of the substrate, and forming the aperture further comprises:
    including the aperture as an attribute of the at least one of the plurality of second features during the design phase of an integrated circuit.

5. The method of claim 1 wherein adding the edge to the at least one of the plurality of second features comprises:
    forming a mandrel having a sidewall that projects outwardly from the surface so that the edge is defined by an intersection of the sidewall with a top surface of the mandrel.

6. The method of claim 5 wherein forming the mandrel comprises:
    depositing a first layer of a first material;
    depositing a second layer of a second material on the first layer;
    patterning the second layer to form the mandrel; and
    patterning the first material in the first layer to form the first plurality of features and the second plurality of features.

7. The method of claim 1 further comprising:
    depositing the conformal layer across the first plurality of features in the first region and the second plurality of features in the second region.

8. The method of claim 7 further comprising:
    anisotropically etching the conformal layer to form spacers on the first plurality of features and the second plurality of features.

9. A method of reducing variations in a ratio of perimeter to surface area between a plurality of first features in a first region on a substrate and a plurality of second features in a second region on a substrate, the method comprising:
    adding a plurality of sub-lithographic fill shapes each having a surface, a sidewall extending from the surface toward a top surface of the substrate, and an edge at an intersection of the surface and sidewall to increase a perimeter density in the second region and thereby reduce a difference in the ratio of perimeter-to-surface area between the plurality of first features in the first region and the plurality of second features in the second region.

10. The method of claim 9 wherein adding the plurality of sub-lithographic fill shapes further comprises:
    selecting a portion of the second region free of the second plurality of features and free of the first plurality of features as a location for the plurality of sub-lithographic fill shapes.

11. The method of claim 9 further comprising:
    applying a layer of a conductive material;
    applying a hardmask layer the conductive material in the layer;
    applying a film of a diblock copolymer on the hardmask layer; and
    patterning the diblock copolymer in the film to define a plurality of sub-lithographic columnar structures masking the hardmask layer.

12. The method of claim 11 further comprising:
    masking the hardmask layer with a plurality of resist features in a resist layer patterned using photolithography;
    etching the hardmask layer selective to the diblock copolymer in the film and the resist layer to transfer a replica of the plurality of sub-lithographic columnar structures and the resist features to the hardmask; and
    etching the conductive layer selective to the etched hardmask layer to concurrently form the first plurality of features, the second plurality of features, and the plurality of sub-lithographic fill shapes.

* * * * *